United States Patent [19]

Yamada et al.

[11] Patent Number: 5,705,019

[45] Date of Patent: Jan. 6, 1998

[54] PLASMA PROCESSING APPARATUS

[75] Inventors: Minoru Yamada, Ikoma-gun; Toshihiro Hayami, Nishinomiya, both of Japan

[73] Assignee: Sumitomo Metal Industries, Ltd., Osaka, Japan

[21] Appl. No.: 636,352

[22] Filed: Apr. 23, 1996

[51] Int. Cl.$^6$ ............................................. H01L 21/00
[52] U.S. Cl. ..................... 156/345; 156/643.1; 216/67
[58] Field of Search ........................... 156/345 P, 345 V, 156/643.1, 662.1; 204/298.34, 298.39; 216/67

[56] References Cited

U.S. PATENT DOCUMENTS 5,584,933  12/1996  Saito ..................... 156/345 P

FOREIGN PATENT DOCUMENTS

| 56-15044 | 2/1981 | Japan . |
| 56-100422 | 8/1981 | Japan . |
| 57-84137 | 5/1982 | Japan . |
| 59-207629 | 11/1984 | Japan . |
| 5-175163 | 7/1993 | Japan . |
| 5-234952 | 9/1993 | Japan . |

*Primary Examiner*—William Powell
*Attorney, Agent, or Firm*—Lane, Aitken & McCann

[57] ABSTRACT

A plasma processing apparatus comprises a reaction chamber, an upper electrode, a lower electrode which confronts the upper electrode and also functions as a sample stage, means of supplying RF power between the upper electrode and lower electrode such that the RF power is supplied to one of the upper and lower electrodes, with another electrode and the reaction chamber being grounded, and RF impedance matching means, wherein the capacitance between the grounded electrode and the reaction chamber is 125 pF or less. The apparatus is capable of stabilizing the plasma generation and alleviating the occurrence of sudden deterioration of the repeatability of plasma processing and unequal performance of plasma processing among individual apparatus. The apparatus can be applied suitably to etching apparatus having small electrode spacing and using a chlorine compound gas or a bromine compound gas such as $Cl_2$ or HBr.

5 Claims, 3 Drawing Sheets

PLASMA PROCESSING APPARATUS

BACKGROUND OF THE INVENTION

1. Field of the Invention

The present invention relates to an RF (radio frequency) plasma processing apparatus of the parallel-plate type used for the etching, ashing and CVD processings for semiconductor substrates and the like.

2. Description of the Related Art

Plasma processing apparatus of the parallel-plate type, in which plasma is generated in the space between the upper and lower electrodes is used widely in the fabricating process of LSI (Large Scale Integration) circuits and LCD (Liquid Crystal Display) panels.

FIG. 1 shows schematically the cross section of a conventional plasma processing apparatus of the parallel-plate type which is capable of switching the supply of RF power to the upper electrode or to the lower electrode.

The upper electrode 12 is insulated from the wall of reaction chamber 19 by an insulation member 18, and the outer section of the upper electrode 12 is covered with a plasma shielding member 17. The upper electrode 12 has a processing gas inlet 16, a diffusion space 14 and numerous apertures 13. Processing gas is supplied through the gas inlet 16 into the reaction chamber 11, and it is evacuated through an evacuation port 26. The upper electrode 12 is cooled by coolant which circulates in a coolant circulation path 15.

The lower electrode 21 is insulated from the chamber wall 19 by an insulation member 24 and its outer section is covered with a plasma shielding member 25. The lower electrode 21 is maintained at a prescribed temperature by circulating the thermal medium in a thermal medium circulation path 23. A sample is placed on the lower electrode.

The apparatus of this type is capable of producing the plasma of two plasma generation modes, which are plasma mode and RIE (Reactive Ion Etching) mode. Plasma generation mode can be selected by the operation of switching means 34,35 and 36. In plasma mode, RF power is supplied to the upper electrode 12, with the lower electrode 21 being grounded, and in RIE mode, RF power is supplied to the lower electrode 21, with the upper electrode 12 being grounded. Therefore, the apparatus of this type is advantageous in performing various processes, e.g. multi-layer etching and the like. The apparatus shown in FIG. 1 is set to plasma mode.

The RF power is generated by an RF power generator 33. The RF impedance is matched by RF matching circuits 31 or 32 according to the plasma generation mode. The chamber wall 19 is grounded in both plasma generation modes. The RF frequency is generally 13.56 MHz.

For the insulation members 18 and 24, the electrical insulation materials such as alumina ($Al_2O_3$), Teflon® and the like have been used in conventional plasma processing apparatus, as disclosed in Japanese patent application Laid-open No.59-207629. However, alumina has become the dominant insulation material recently, because of its superior properties of less thermal deformation under high-temperature environments, larger mechanical strength and greater durability against plasma as compared with other materials.

The upper electrode 12 and the lower electrode 21 are made of aluminum (Al), and the plasma shielding members 17 and 25 are generally made of alumina.

On the other hand recent plasma processing apparatus are required to be capable of the higher processing rate and sub-micron pattern fabrication. In order to meet these requirements, apparatus with smaller electrode spacing (15 mm or less) which is capable of producing high-density plasma under a lower pressure region is used more commonly, in contrast to a conventional apparatus with larger electrode spacing (20–50 mm). However, apparatus with smaller electrode spacing is liable to generate unstable plasma discharge in exchange for high-density plasma generation.

In regard to processing gas, conventional plasma processing apparatus use mainly fluorocarbon gas (e.g., $CF_4$) having properties of easy handling and stable plasma discharge. Recently, chlorine compound gas and bromine compound gas (e.g., $Cl_2$ and HBr) are becoming the dominant processing gas, particularly for etching poly-silicon films, because it has become well known that they are suitable for sub-micron pattern fabrication. Chlorine compound gas and bromine compound gas are also liable to generate unstable plasma discharge however.

Due to the aforementioned reasons, the conventional plasma processing apparatus of the parallel-plate type is becoming deficient recently in that the repeatability of plasma processing is deteriorated suddenly as a result of aging of the apparatus and the performance of plasma processing is unequal among individual apparatus.

Generally, an RF matching circuit is provided between the RF power generator and the electrode to which RF power is supplied, to match the RF impedance thereby to stabilize the plasma discharge. Because the stability of plasma discharge depends on the impedance matching among plasma, RF power generator, upper and lower electrodes and reaction chamber.

However, due to the above-mentioned structure of smaller electrode spacing and use of chlorine or bromine compound gas, stabilization of plasma discharge by means of the conventional RF matching circuit is difficult in some cases, resulting in a sudden deterioration of the repeatability of plasma processing and unequal performance of plasma processing among individual apparatus.

The deterioration of process repeatability and unequal performance among apparatus are becoming major problems of plasma processing apparatus of the parallel-plate type that is operative by switching the RF power supply to the upper or lower electrode.

SUMMARY OF THE INVENTION

The present invention is intended to overcome the foregoing problems, and its object is to provide a plasma processing apparatus that is free from the sudden deterioration of the repeatability of plasma processing and from unequal performance among individual apparatus.

A sudden deterioration of the repeatability of plasma processing and unequal performance of plasma processing among individual apparatus is caused by the failure of stabilization of plasma discharge.

The inventors of the present invention have studied the causes of the failure of stabilization of plasma discharge by the usual matching circuit, and found that in the plasma processing apparatus with the devices for switching the RF supply to the upper or lower electrode as shown in FIG. 1, the inductance between the grounded electrode and the reaction chamber varies with the operation period due to the decay of contacts of the switching devices 34 and 35, and the inductance inequality among individual apparatus.

The inventors also found that the value of resonant inductance which is defined as the inductance when the impedance between the grounded electrode and the reaction chamber becomes infinite was within the variation range of its inductance in the conventional plasma processing apparatus.

Based on these facts, it was concluded that in the conventional plasma processing apparatus the value of resonant inductance was within the variation range of its inductance, and therefore in case the inductance between the grounded electrode and reaction chamber becomes close to the resonant inductance, the impedance varies remarkably, and it makes it difficult to match the RF impedance sufficiently, and therefore it adversely affects the stability of plasma discharge.

Due to this conclusion the inventors completed the present invention. The present invention's strength resides in stabilizing plasma discharge by either reducing or varying the value of the capacitance between the grounded electrode and the reaction chamber, and intentionally varying the resonant inductance from the variation range of the inductance.

Accordingly, one of the present invention resides in a plasma processing apparatus comprising a reaction chamber, an upper electrode, a lower electrode which also functions as a sample stage, means of supplying RF power between the upper electrode and lower electrode such that the RF power is supplied to one of the upper or lower electrode, with another electrode and the reaction chamber being grounded, and RF impedance matching means, wherein the capacitance $C_{dc}$ between the grounded electrode and the reaction chamber is 125 pF or less.

By making the capacitance $C_{dc}$ between the grounded electrode and reaction chamber 125 pF or less at a frequency of 13.56 MHz, the value of resonant inductance $L_m$ between the grounded electrode and reaction chamber becomes 1100 nH or more, which is outside the variation range 400–1000 nH of inductance $L_{dc}$ between the grounded electrode and reaction chamber. Consequently, plasma discharge can be stabilized by means of the usual RF impedance matching circuit.

The other of the present invention resides in a plasma processing apparatus comprising a reaction chamber, an upper electrode, a lower electrode which also functions as a sample stage, means of supplying RF power between the upper electrode and lower electrode such that the RF power is supplied to one of the upper or lower electrode, with another electrode and the reaction chamber being grounded, RF impedance matching means, and means of varying the capacitance $C_{dc}$ between the grounded electrode and said reaction chamber.

Based on this structure with means of varying the capacitance $C_{dc}$ between the grounded electrode and said reaction chamber provided, in case the inductance $L_{dc}$ becomes close to the resonant inductance $L_m$, the capacitance $C_{dc}$ is varied intentionally thereby to cause the resonant inductance $L_m$ to vary from the $L_{dc}$. Consequently, plasma discharge can be stabilized by means of the usual RF impedance matching circuit.

DETAILED DESCRIPTION

Figure 1:
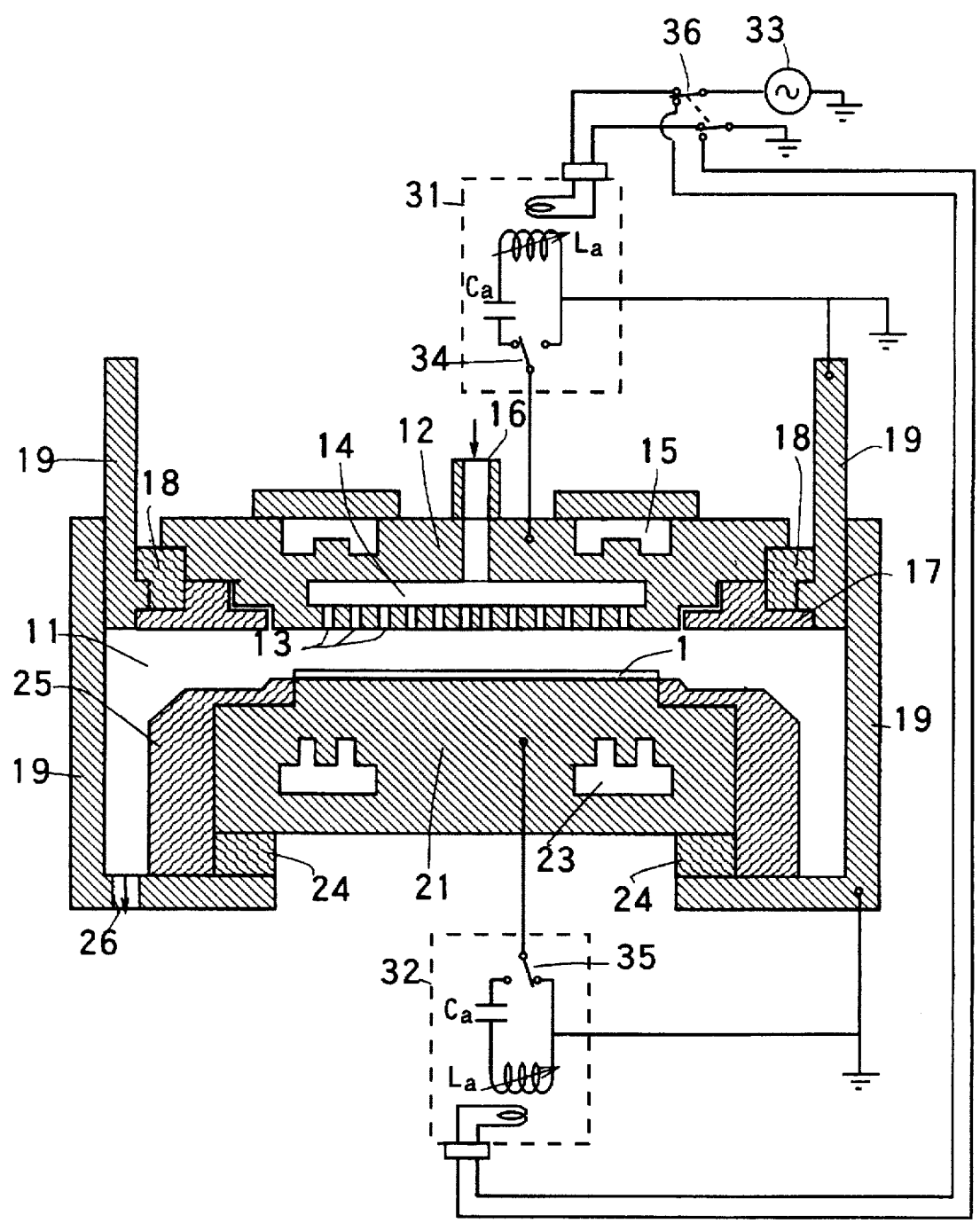
FIG. 1 is a schematic longitudinal cross-sectional diagram of a plasma processing apparatus of the parallel-plate type which is capable of switching the supply of RF power to the upper electrode or to the lower electrode.

The inventors of the present invention have studied the cause of the failure of stabilization of plasma discharge by the usual matching circuit, and found that in the plasma processing apparatus with the devices for switching the RF supply to the upper or lower electrode as shown in FIG. 1, the inductance L between the grounded electrode and the reaction chamber varies with the operation period due to the decay of contacts of the switching devices 34 and 35,and the inductance L inequality among individual apparatus.

Based on these facts, it was inferred that the fluctuation and inequality of inductance L adversely affect the stability of plasma discharge.

Figure 2:
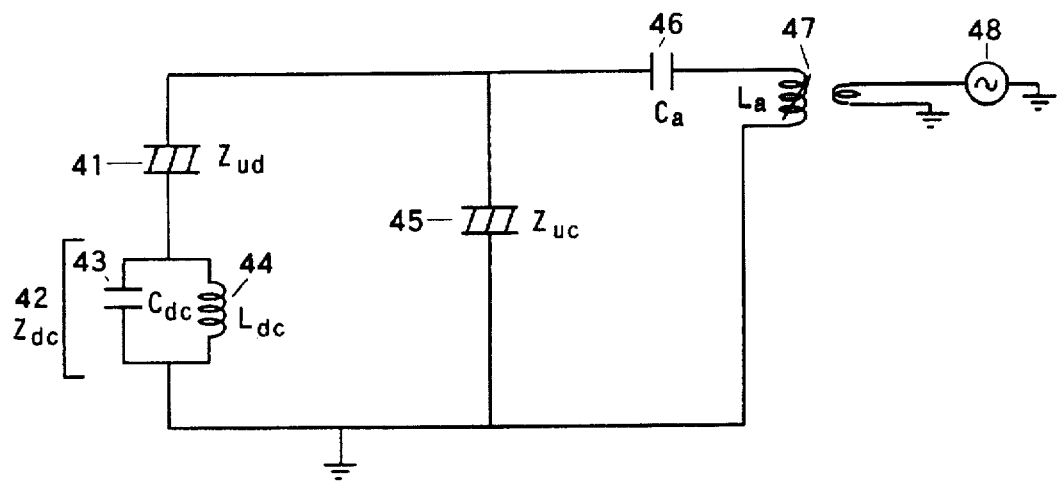
FIG. 2 is an RF equivalent circuit diagram of the plasma processing apparatus of FIG. 1.

FIG. 2 shows the RF equivalent circuit of the plasma processing apparatus of FIG. 1 in plasma mode with the supply of RF power to the upper electrode 12 against the grounded lower electrode 21 at a time of generating plasma. The equivalent circuit includes a capacitance ($C_a$) 46 and variable inductance ($L_a$) 47 of the RF matching circuit 31, an impedance ($Z_{ud}$) 41 between the upper electrode 12 and the lower electrode 21 through plasma, an impedance ($Z_{uc}$) 45 between the upper electrode 12 and chamber wall 19 through the insulation member and plasma, and an impedance ($Z_{dc}$) 42 between the lower electrode 21 and chamber wall 19 made up of a capacitance ($C_{dc}$) 43 and an inductance ($L_{dc}$) 44. The impedance $Z_{dc}$ is described as follows:

$$Z_{dc}=2\pi f L_{dc}/(1-4\pi^2 f^2 C_{dc}L_{dc}) \quad (1)$$

where f is the RF frequency.

The plasma processing apparatus of FIG. 1 has its impedance $Z_{dc}$ existing in series to the impedance $Z_{ud}$, and therefore the variation of the impedance $Z_{dc}$ causes the plasma generation to vary.

It is generally possible to match the total impedance against the variation of impedance $Z_{dc}$ by the adjustment of the variable inductance $L_a$. However, there exists the impedance $Z_{uc}$ between the upper electrode 12 and chamber wall 19, which is in parallel to the impedance $Z_{dc}$. In case the presence of the impedance $Z_{uc}$ is not negligible, sufficient impedance matching will be difficult, and therefore the fluctuation of impedance $Z_{dc}$ itself must be minimized.

The impedance $Z_{dc}$ of the above formula (1) becomes infinite when condition $4\pi^2 f^2 C_{dc}L_{dc}=1$ is met (i.e., resonance condition), and therefore when the inductance $L_{dc}$ is close to the resonant inductance $L_m$ that meets this condition, the value of impedance $Z_{dc}$ will be highly responsive to the variation of inductance $L_{dc}$.

The inventors have measured the inductance $L_{dc}$ at a frequency of 13.56 MHz by an LCR meter on several plasma processing apparatus having the structure shown in FIG. 1. The result of measurement revealed that the inductance $L_{dc}$ varies greatly between 400 nH and 1000 nH. The cause of inductance variation is presumed to be the decay and the fluctuation of relay contacts within the RF matching circuits and the fluctuation of the contact condition of RF component parts when they are assembled.

The inventors have measured the capacitance $C_{dc}$ for the apparatus shown in FIG. 1 having the insulation members 18 and 24 made of alumina. The capacitance $C_{dc}$ was found to be 158 pF, and the resonant inductance $L_m$ at 13.56 MHz was 872 nH which is within the abovementioned variation range of $L_{dc}$. It was concluded that due to the value of $L_m$ within the variation range of $L_{dc}$ of the conventional plasma processing apparatus, the impedance $Z_{dc}$ varies remarkably when the value of $L_{dc}$ becomes close to the resonant inductance $L_m$ and the generated plasma varies remarkably in response to the variation of $Z_{dc}$.

The present invention is based on the idea that by shifting the resonant inductance $L_m$ out of the variation range of $L_{dc}$, it should be possible to stabilize the plasma discharge with the usual RF impedance matching circuit.

Accordingly, the present invention resides in a plasma processing apparatus comprising a reaction chamber, an upper electrode, a lower electrode which also functions as a sample stage, means of supplying RF power between the upper electrode and lower electrode such that the RF power is supplied to one of the upper or lower electrode, with another electrode and the reaction chamber being grounded, and RF impedance matching means, wherein the capacitance $C_{dc}$ between the grounded electrode and the reaction chamber is 125 pF or less. Generally the capacitance $C_{dc}$ in this structure of apparatus is inherently 105 pF or more.

By making the capacitance $C_{dc}$ between the grounded electrode and reaction chamber 125 pF or less at a frequency of 13.56 MHz, the value of resonant inductance $L_m$ becomes 1100 nH or more, which is outside the variation range 400–1000 nH of $L_{dc}$. Accordingly, even if the $L_{dc}$ varies due to the decay of relay contacts, it does not approach the resonant inductance $L_m$, and thus remarkable variation of impedance $Z_{dc}$ does not occur. Consequently, plasma discharge can be stabilized by means of the usual RF impedance matching circuit, and the possibility of sudden deterioration of the repeatability of plasma processing and unequal performance of plasma processing among individual apparatus can be alleviated. The foregoing principle in connection with plasma mode is also relevant to the case of RIE mode.

In order to make the capacitance $C_{dc}$ between the grounded electrode and reaction chamber 125 pF or less, it is desirable to insulate the grounded electrode from the reaction chamber with an insulation member having a relative dielectric constant of 3.6 or less.

The following Table 1 lists the result of measurement of the capacitance $C_{dc}$ and the result of calculation of the resonant inductance $L_m$ (at a frequency of 13.56 MHz) for the apparatus shown in FIG. 1 having the insulation member 24 made of alumina and Teflon® respectively between the lower electrode 21 and chamber wall 19.

TABLE 1

| Material of insulation member | Relative dielectric constant | Capacitance (pF) | Resonant inductance (nH) |
|---|---|---|---|
| Alumina | 9 | 158.0 | 872 |
| Teflon | 2 | 115.2 | 1195 |

Based on the interpolation for these values, the capacitance can be made 125 pF or less by using an insulation member having a relative dielectric constant of 3.6 or less, as follows:

$$(115 \times (9-3.6) + 158 \times (3.6-2))/(9-2) = 125 \quad (2)$$

The insulation member having such a smaller relative dielectric constant does not need to be thicker even if the capacitance should be made 125 pF or less, and therefore it does not affect the design of apparatus so much.

Besides Teflon® of fluorocarbon polymer, materials having a relative dielectric constant of 3.6 or less include Kapton® and Vespel® of aromatic polymer and KEL-F® of chloro tetra fluoro ethylene. Kapton®, Vespel® and KEL-F® have relative dielectric constants of 3.5, 3.5 and 2.5, respectively.

It is not necessary to use insulation material with a relative dielectric constant of 3.6 or less for all places to be insulated between the grounded electrode and reaction chamber, but it may be used only for places between these members that are highly influential on the impedance, e.g., portions of the members close to each other.

In contrast to the foregoing scheme that is intended to let the resonant inductance $L_m$ deviate fixedly from the variation range of the inductance between the grounded electrode and reaction chamber, an alternative scheme for stabilizing the plasma generation is to vary the resonant inductance $L_m$ through the provision of a means of varying the capacitance between the grounded electrode and reaction chamber.

Specifically, in case the inductance $L_{dc}$ between the grounded electrode and reaction chamber becomes close to the resonant inductance $L_m$, the capacitance $C_{dc}$ between these members is varied intentionally thereby to cause the resonant inductance $L_m$ to vary so that the $L_m$ much differs from the $L_{dc}$. Consequently, plasma discharge can be stabilized by means of the usual RF impedance matching circuit.

The foregoing structure is suitable for plasma processing apparatus with small electrode spacing of 5–15 mm that are liable to generate unstable plasma discharge, and is suitable for etching apparatus using a chlorine compound gas or a bromine compound gas (e.g., $Cl_2$, HBr), particularly poly-silicon etching apparatus, that are liable to generate unstable plasma discharge.

Embodiments of this invention will be explained with reference to the drawings.

The plasma processing apparatus based on a first embodiment of the invention is different from the structure of the conventional apparatus explained previously in connection with FIG. 1 only in reducing the capacitance $C_{dc}$ between the grounded electrode and reaction chamber. The insulation members 24 and 18 are made of Teflon®. This Teflon includes glassfiber by 25 weight-% with the intention of reinforcement and has a relative dielectric constant of 2.0.

Figure 3:
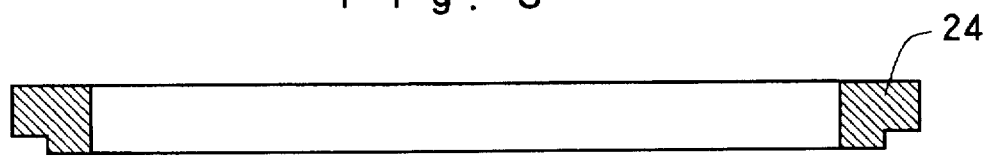
FIG. 3 is a schematic longitudinal cross-sectional diagram of the insulation member 24 used in the plasma processing apparatus of FIG. 1.

FIG. 3 shows the longitudinal cross section of the insulation member 24. The insulation member 24 of ring shape has an inner diameter of 216 mm, an outer diameter of 258 mm and a thickness of 17 mm. In case the lower electrode 21 is grounded, the capacitance $C_{dc}$ between the lower electrode 21 and the chamber wall 19 with the interposition of the insulation member 24 is 115.2 pF.

The upper electrode 12 and lower electrode 21 are made of aluminum (Al), and the plasma shielding members 17 and 25 are made of alumina ($Al_2O_3$). The RF power frequency is 13.56 MHz. The etching rate of poly-silicon film discussed in the following was measured in plasma mode in which RF power is supplied to the upper electrode 12 against the grounded lower electrode 21.

For the apparatus of this embodiment, the influence of the inductance between the lower electrode and reaction chamber on the etching rate of poly-silicon film was measured. The inductance was varied intentionally by varying the length of a copper plate which provides the electrical conductivity between the lower electrode and reaction chamber.

The etching condition was as follows. Processing gas flow rate: $Cl_2$:200 sccm, HBr:75 sccm, He:200 sccm; Pressure:425 mTorr; electrode spacing:10 mm; RF power:350 W.

The same-measurement was conducted for the purpose of comparison for the apparatus having the insulation members 24 and 18 made of alumina, in which case the capacitance $C_{dc}$ between the lower electrode and chamber wall is 158.0 pF.

Figure 4:
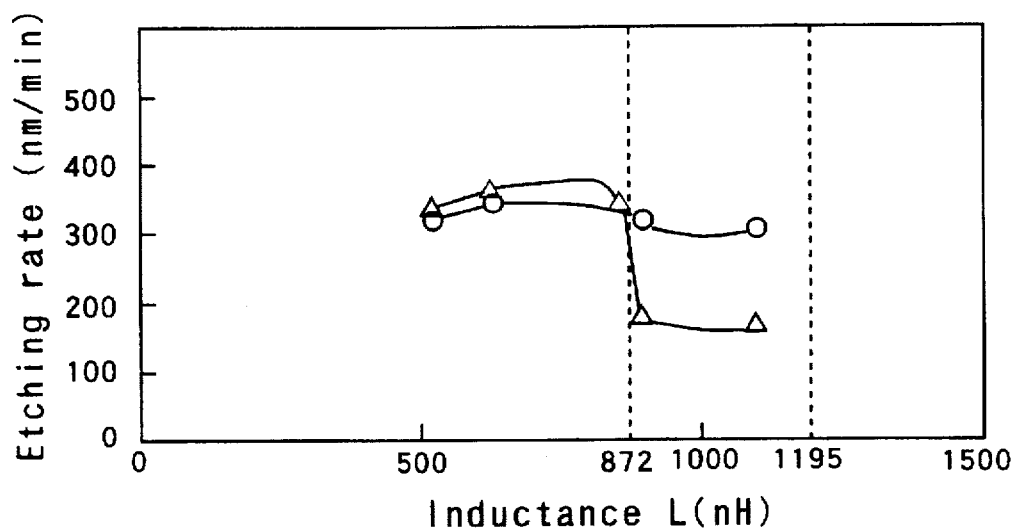
FIG. 4 is a graph showing the result of measurement of the etching rate of poly-silicon film, with plots "○" indicating the result of the inventive apparatus and plots "△" indicating the result of the conventional apparatus.

FIG. 4 shows the results of measurement of the poly-silicon etching rate. In this graph, the etching rate is plotted on the vertical axis against the inductance $L_{dc}$ between the lower electrode 21 and chamber wall 19 on the horizontal axis. Plots "○" are the result based on this embodiment, while plots "Δ" are the result of the comparative apparatus. The measurement results reveal that the poly-silicon etching rate of the inventive apparatus is virtually stable at 350 nm/min in the presence of the variation of inductance $L_{dc}$, in contrast to a remarkable variation of the etching rate with the variation of inductance $L_{dc}$ in the case of the comparative apparatus. In the case of the comparative apparatus, the etching rate varied sharply at inductance 872 nH that is the resonant inductance point attributable to the insulation member made of alumina, and it was confirm from this fact that the variation of impedance $Z_{dc}$ affects the plasma generation significantly.

The apparatus of this embodiment was operated cyclically in plasma mode and RIE mode alternately, and it was confirmed that the occurrence times of sudden deterioration of the repeatability of plasma processing was reduced. It was also confirmed that unequal performance of plasma processing among individual apparatus is alleviated as compared with the conventional apparatus.

Figure 5:
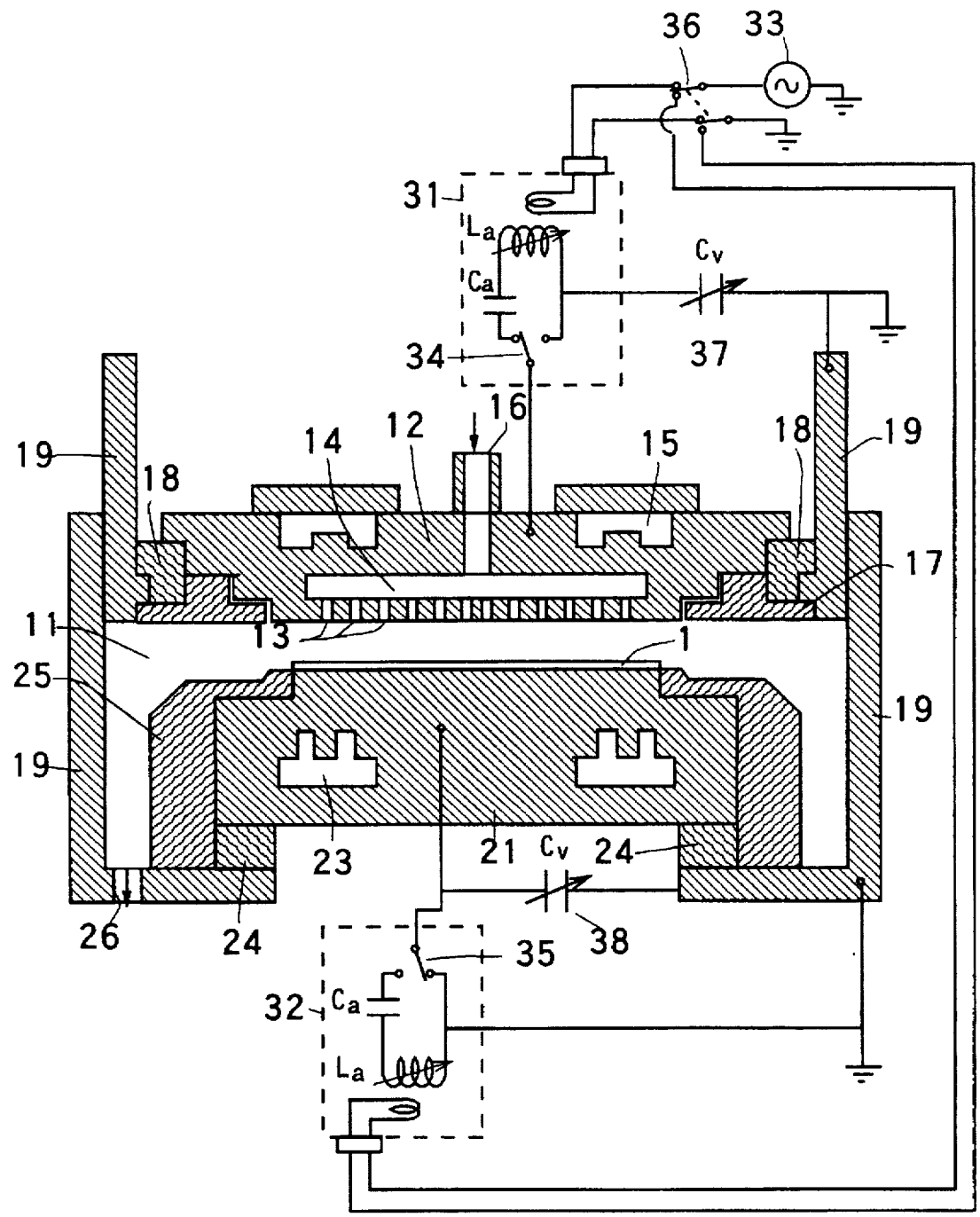
FIG. 5 is a schematic longitudinal cross-sectional diagram of the plasma processing apparatus based on another embodiment of this invention.

FIG. 5 shows the longitudinal cross section of the plasma processing apparatus based on another embodiment of this invention, in which is included a means of varying the capacitance between the grounded electrode and reaction chamber.

The apparatus of this embodiment has the same basic structure as the one shown in FIG. 1, with variable capacitors 37 and 38 being provided additionally between the upper electrode 12 and chamber wall 19 and between the lower electrode 21 and chamber wall 19. In operation, for example, if the inductance $L_{dc}$ between the lower electrode 21 and chamber wall 19 becomes close to the resonant inductance $L_m$, the capacitance $C_{dc}$ between these members 21 and 19 is varied intentionally so that the resonant inductance $L_m$ deviates greatly from the $L_{dc}$, thereby alleviating the instability of plasma generation.

The inventive plasma processing apparatus exerts its performance particularly in case the spacing between the upper and lower electrode is as small as 5 to 15 mm in which case plasma discharge is liable to become unstable.

The inventive plasma processing apparatus is suitable for the case of using a chlorine compound gas, a bromine compound gas, (e.g., $Cl_2$, HBr) and the like, particularly for poly-silicon film etching, in which case plasma discharge is liable to become unstable.

According to the plasma processing apparatus of this invention, as described above, the instability of plasma discharge is dissolved by keeping the inductance L between the grounded lower electrode and chamber wall deviate greatly from the resonant inductance $L_m$. Consequently, the sudden deterioration of the repeatability of plasma processing and unequal performance of plasma processing among individual apparatus can be alleviated.

What is claimed is:

1. A plasma processing apparatus comprising:

a reaction chamber;

an upper electrode;

a lower electrode which confronts said upper electrode and also functions as a sample stage;

means of supplying RF power between said upper electrode and said lower electrode, said RF power being supplied to one of said upper or lower electrode, with another of said electrodes and said reaction chamber being grounded, and means of matching the RF impedance, wherein the capacitance between the grounded electrode and said reaction chamber is 125 pF or less.

2. A plasma processing apparatus according to claim 1, wherein the grounded electrode is insulated from said reaction chamber with an insulation member having a relative dielectric constant of 3.6 or less.

3. A plasma processing apparatus according to claim 1, wherein the spacing between said upper electrode and said lower electrode is 5 mm or more and 15 mm or less.

4. A plasma processing apparatus comprising:

a reaction chamber;

an upper electrode;

a lower electrode which confronts said upper electrode and also functions as a sample stage;

means of supplying RF power between said upper electrode and said lower electrode, said RF power being supplied to one of said upper or lower electrode, with another of said electrodes and said reaction chamber being grounded;

means of matching the RF impedance; and means of varying the capacitance between the grounded electrode and said reaction chamber.

5. A plasma processing apparatus according to claim 4, wherein the spacing between said upper electrode and said lower electrode is 5 mm or more and 15 mm or less.

* * * * *